*(12)* United States Patent
Jian et al.

(10) Patent No.: US 9,160,302 B2
(45) Date of Patent: Oct. 13, 2015

(54) ACOUSTIC WAVE BAND REJECT FILTER

(71) Applicant: Telefonaktiebolaget L M Ericsson (publ), Stockholm (SE)

(72) Inventors: Chunyun Jian, Ottawa (CA); Somsack Sychaleun, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 238 days.

(21) Appl. No.: 13/788,587

(22) Filed: Mar. 7, 2013

(65) Prior Publication Data

US 2014/0145800 A1     May 29, 2014

Related U.S. Application Data

(63) Continuation-in-part of application No. 13/726,668, filed on Dec. 26, 2012.

(60) Provisional application No. 61/730,656, filed on Nov. 28, 2012.

(51) Int. Cl.
    *H03H 9/54*        (2006.01)
    *H03H 9/46*        (2006.01)
    *H03H 9/64*        (2006.01)
    *H03H 9/60*        (2006.01)

(52) U.S. Cl.
CPC .................. *H03H 9/46* (2013.01); *H03H 9/542* (2013.01); *H03H 9/547* (2013.01); *H03H 9/605* (2013.01); *H03H 9/64* (2013.01); *H03H 9/6409* (2013.01); *H03H 9/6483* (2013.01)

(58) Field of Classification Search
CPC ....................................................... H03H 9/54

USPC .......................................... 333/189, 193, 133
See application file for complete search history.

(56) References Cited

U.S. PATENT DOCUMENTS 4,910,481 A  *   3/1990   Sasaki et al. ................... 333/134
6,710,677 B2       3/2004   Beaudin et al.
(Continued)

FOREIGN PATENT DOCUMENTS

EP         0 422 637 A2      4/1991
EP         1 398 876 A1      3/2004

OTHER PUBLICATIONS

Mourot_etal_ Stopband Filters Built in the BAW Technology, Published Oct. 2008, IEEE Microwave Magazine pp. 104-116, date of current version Sep. 9, 2008, consisting of 7-pages.
Invitation to Pay Additional Fees dated May 8, 2014 for International Application No. PCT/IB2013/060344, International Filing Date: Nov. 22, 2013 consisting of 8-pages.
(Continued)

*Primary Examiner* — Dinh Le
(74) *Attorney, Agent, or Firm* — Christopher & Weisberg, P.A.

(57) ABSTRACT

A method and system for an acoustic wave band reject filter are disclosed. According to one aspect, an acoustic wave band reject filter includes a substrate and a plurality of acoustic wave band reject filter circuit blocks. The substrate includes bonding pads formed on the substrate. Each one of the plurality of acoustic wave band reject filter circuit blocks is fixed on a separate die. Each separate die has solder balls on a side of the die facing the substrate. The solder balls are positioned to electrically connect the bonding pads formed on the substrate to electrodes of the dies.

16 Claims, 10 Drawing Sheets

(56) References Cited

U.S. PATENT DOCUMENTS

| | | | |
|---|---|---|---|
| 6,924,715 | B2 | 8/2005 | Beaudin et al. |
| 7,777,597 | B2 | 8/2010 | Beaudin et al. |
| 7,821,358 | B2 | 10/2010 | Block et al. |
| 8,018,304 | B2 | 9/2011 | Jian |
| 8,060,156 | B2 | 11/2011 | Gagnon et al. |
| 8,204,031 | B2 | 6/2012 | Jian et al. |
| 2007/0111335 | A1* | 5/2007 | Miyazawa et al. ............. 438/3 |
| 2011/0235557 | A1 | 9/2011 | Jian |
| 2013/0271242 | A1* | 10/2013 | Bauer et al. ................. 333/189 |

OTHER PUBLICATIONS

International Search Report and Written Opinion dated Jul. 16, 2014 for International Application No. PCT/IB2013/060344, International Filing Date: Nov. 22, 2013 consisting of 21-pages.

Chun-Yun et al., "SAW Band Reject Filter Performance at 850 MHz" IEEE Ultrasonics Symposium Proceedings, (IUS), 2005, pp. 2162-2165.

Thomas Bauer et al., "SAW Band Rejection Filters for Mobile Digital Television", IEEE Ultrasonics Symposium Proceedings, (IUS), 2008, pp. 288-291.

* cited by examiner

FIG. 19

ACOUSTIC WAVE BAND REJECT FILTER

CROSS-REFERENCE TO RELATED APPLICATION

This application is a continuation-in-part of U.S. patent application Ser. No. 13/726,668, filed Dec. 26, 2012, entitled ACOUSTIC WAVE BAND REJECT FILTER, which claims priority to U.S. Provisional Application Ser. No. 61/730,656, filed Nov. 28, 2012, entitled ACOUSTIC WAVE BAND REJECT FILTER, the entirety of both of which are incorporated herein by reference.

TECHNICAL FIELD

The present invention relates to filters, and in particular to acoustic wave band reject filters.

BACKGROUND

Band reject filters may be used in wireless network equipment, such as in base stations. Desirably, these band reject filters should be miniature in size to reduce the overall size of equipment in which they are installed. Surface acoustic wave (SAW), bulk acoustic wave (BAW) and film bulk acoustic resonators (FBAR) have been used to implement miniature band pass filters, but have not been widely used in band reject filter implementations, primarily due to a lack of demand for such implementations in wireless network equipment that are based on first generation (1G) and second generation (2G) wireless communication standards.

However, with the emergence of implementations of third generation (3G) and fourth generation (4G) wireless communication standards, frequency spectrum allocation is constrained, requiring very closely spaced frequency channels. This means that filters in a radio frequency (RF) front end must have steep transition bands to avoid interference. Steep transitions can be achieved with band reject filters having high Q. However, when high Q band reject filters are implemented using conventional components, such as air cavity filters, such filters are undesirably large in size and are relatively expensive.

Acoustic wave filters such as the SAW, BAW and FBAR filters, have been used to implement band pass filters, but not miniature band reject filters having steep transitions bands and deep reject bands.

SUMMARY

The present invention advantageously provides a method and system for providing an acoustic wave band reject filter. According to one aspect, an acoustic wave band reject filter includes a substrate that includes bonding pads formed on the substrate. A plurality of dies are provided, each die having a side facing the substrate and having electrodes. The filter has a plurality of acoustic wave band reject filter circuit blocks having electrodes. At least one acoustic wave band reject filter circuit block is fixed on a corresponding die. Each of the plurality of acoustic wave band reject filter circuit blocks has at least one resonator. An acoustic wave band reject filter circuit block is fixed on the side of the corresponding die facing the substrate. A plurality of solder balls are positioned between the substrate and the dies, to electrically connect bonding pads on the substrate and corresponding electrodes on the plurality of dies and to mechanically fix the dies to the substrate. At least one of the bonding pads on the substrate electrically connect adjacent dies via the solder balls. The plurality of acoustic wave band reject filter circuit blocks collectively exhibit a band reject filter frequency response.

In one embodiment, each of the plurality of acoustic wave band reject filter circuit blocks have adjacent, partially overlapping band reject filter frequency responses. An acoustic wave band reject filter circuit block may be arranged as one of a series-parallel-series (T-type) electrical circuit configuration and a parallel-series-parallel (pi-type) electrical circuit configuration. An acoustic wave band reject filter circuit block may be one of a surface acoustic wave filter, a bulk acoustic wave filter, and a film bulk acoustic resonator filter. In one embodiment the acoustic wave band reject filter further comprises an inductor external to the substrate, wherein at least one bonding pad electrically connects the external inductor to one of the plurality of dies via the solder balls. The external inductor may be electrically connected to a bonding pad positioned between dies. In some embodiments a single die may have a plurality of acoustic wave band reject filter circuit blocks According to another aspect, the invention provides a method for constructing an acoustic wave band reject filter. The method includes forming bonding pads on a substrate and providing a plurality of dies, each die having a side that faces the substrate. Each die may have a length and a width, a largest one of the length and width being less than about 3 millimeters to reduce thermal mismatch between a die and the substrate. The method includes forming solder balls on one of the substrate and each of the plurality of dies on the sides of the dies facing the substrate. An acoustic wave band reject filter circuit block is formed on each one of the plurality of dies on the side of the die facing the substrate. The plurality of dies are positioned on the substrate such that the solder balls electrically connect electrodes of the dies and bonding pads of the substrate and to mechanically fix the dies to the substrate.

In some embodiments, the acoustic wave band reject filter circuit blocks are cascaded. The method may then further comprise providing connecting bonding pads on the substrate, the connecting bonding pads electrically connecting adjacent cascaded acoustic wave band reject filter circuit blocks that, in some embodiments, have adjacent overlapping band reject filter frequency responses. Some embodiments further comprise providing an inductor external to the substrate, wherein at least one bonding pad electrically connects to external inductor to one of the plurality of dies through the solder balls In one embodiment, the external inductor is electrically connected to a bonding pad positioned between dies. In one embodiment, the acoustic wave band reject filter circuit blocks comprise two electrically series-parallel-series band reject filter circuit blocks separated by an electrically parallel-series-parallel band reject filter circuit block. In another embodiment, the acoustic wave band reject filter circuit blocks comprise two electrically parallel-series-parallel band reject filter circuit blocks separated by an electrically series-parallel-series band reject filter circuit block.

According to another aspect, the invention provides an acoustic wave band reject filter. The acoustic wave band reject filter includes a substrate having bonding pads thereon. A first die having electrodes and a second die having electrodes and each have a side that faces the substrate. A plurality of solder balls are positioned to electrically connect bonding pads of the substrate to electrodes of the first and second dies. A first acoustic wave band reject filter circuit is formed on the first die. A second acoustic wave band reject filter circuit is formed on the second die. A first connecting bonding pad is formed on the substrate and configured to electrically connect the first acoustic wave band reject filter circuit to the second acoustic wave band reject filter circuit via the solder balls.

In some embodiments, the acoustic wave band reject filter further comprises a third die having a side facing the substrate and having electrodes. A plurality of solder balls are positioned to electrically connect bonding pads of the substrate to electrodes on the third die. A third acoustic wave band reject filter circuit is formed on the third die. A second connecting bonding pad is formed on the substrate and configured to electrically connect the second acoustic wave band reject filter circuit to the third acoustic wave band reject filter circuit via the solder balls. In some embodiments, the first and second acoustic wave band reject filter circuits have adjacent overlapping band reject filter frequency responses. In another embodiment, the first acoustic wave band reject filter circuit is one of a series-parallel-series circuit and a parallel-series-parallel circuit. In another embodiment, the second acoustic wave band reject filter circuit is one of a series-parallel-series circuit and a parallel-series-parallel circuit.

According to yet another aspect, the invention provides an acoustic wave band reject filter having a substrate, a first die and at least one inductor. The substrate has bonding pads formed thereon. The first dies is fixed on the substrate and has at least one band reject filter circuit block formed on the first die. The at least one band reject filter circuit block is at least one of a pi type and a T type configuration. The at least one inductor is connected in parallel with at least one of the at least one band reject filter circuit block In some embodiments, the acoustic wave band reject filter further includes at least one additional die having at least one acoustic wave band reject filter circuit block formed thereon. The at least one additional die is cascaded with the first die. In some embodiments, a frequency response of the at least one band reject filter bock formed on the first die partially overlaps a frequency response of the at least one band reject filter circuit block formed on the at least one additional die.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Before describing in detail exemplary embodiments that are in accordance with the present invention, it is noted that the embodiments reside primarily in combinations of apparatus components and processing steps related to providing an acoustic wave band reject filter. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 1:
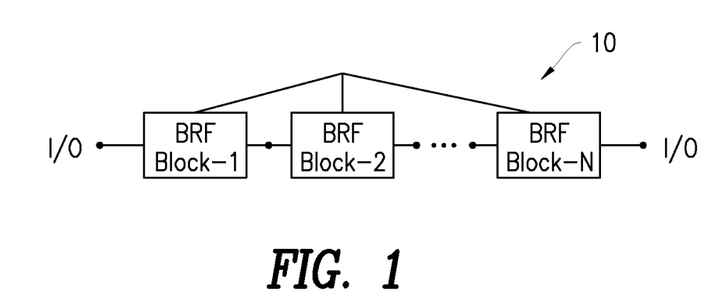
FIG. 1 is a block diagram of cascaded acoustic wave band reject filter circuit blocks constructed in accordance with principles of the present invention.
Figure 2:
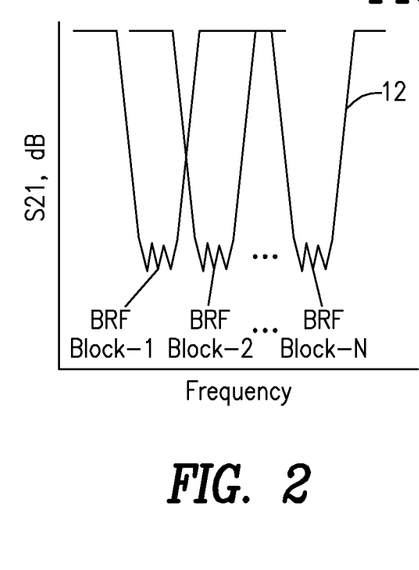
FIG. 2 is graph of adjacent overlapping band reject regions of acoustic wave band reject filter circuit blocks.
Figure 3:
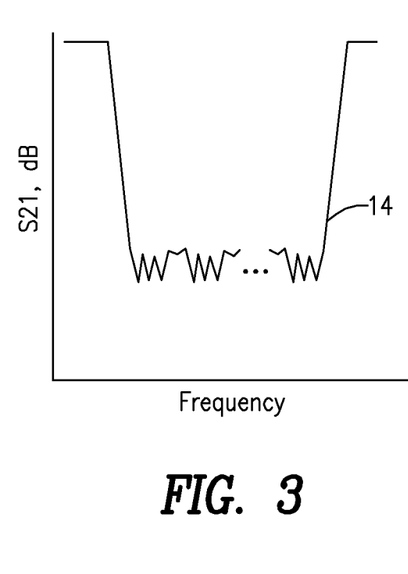
FIG. 3 is a graph of a resultant overall frequency response of cascaded acoustic wave band reject filter circuit blocks having the responses shown in FIG. 2.

Referring to the drawing figures, there is shown in FIG. 1 a block diagram of cascaded acoustic wave band reject filter circuit blocks 10 constructed in accordance with principles of the present invention. The acoustic wave band reject filter circuit blocks are well-matched in their respective upper and lower pass bands. In one embodiment, each acoustic wave band reject filter circuit block 10 has an acoustic wave band reject filter response 12, as shown in FIG. 2. FIG. 2 shows that the acoustic wave band reject filter responses of individual acoustic wave band reject filter circuit blocks may be adjacent and partially overlap. FIG. 3 is a graph of a resultant frequency response 14 of cascaded acoustic wave band reject filter circuit blocks having the responses 12 shown in FIG. 2. The overall bandwidth of the reject band region of FIG. 3 depends on the number N of individual acoustic wave band reject filter circuit blocks 10.

Figure 4:
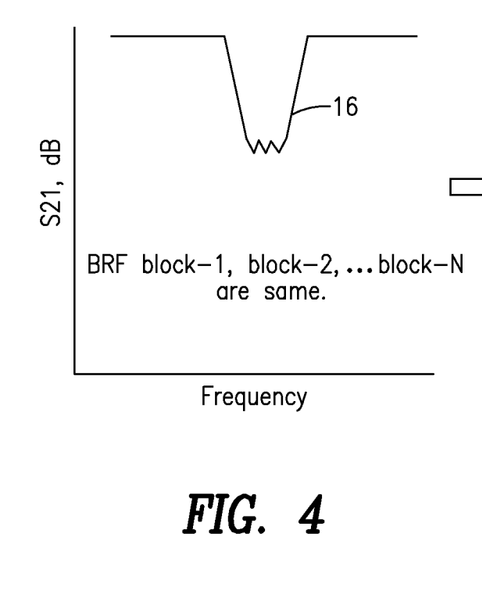
FIG. 4 is a graph of responses of individual acoustic wave band reject filter circuit blocks having reject bands centered at the same frequency.
Figure 5:
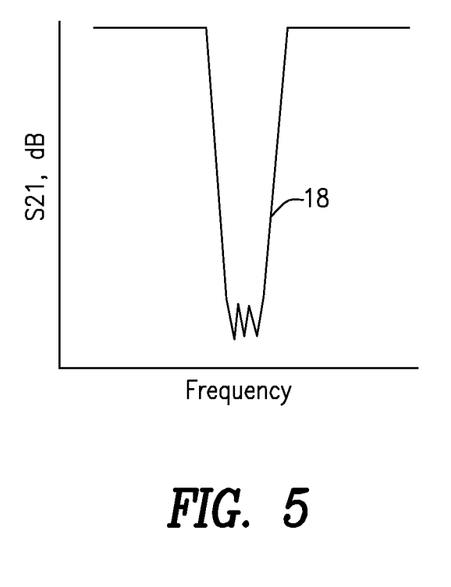
FIG. 5 is a graph of a resultant frequency response of cascaded acoustic wave band reject filter circuit blocks having the individual responses shown in FIG. 4.

In another embodiment, each of the plurality of acoustic wave band reject filter circuit blocks 10 of FIG. 1 has the approximate frequency response 16 shown in FIG. 4. FIG. 5 is a graph of a resultant approximate frequency response 18 of cascaded acoustic wave band reject filter circuit blocks having the responses 16 shown in FIG. 4. The depth of the reject band region depends on the number N of individual acoustic wave band reject filter circuit blocks 10.

Note that the filters of the embodiment of FIG. 2 and the embodiment of FIG. 4 can be combined to achieve a reject band that is as wide and as deep as desired. To achieve the desired response, a combination of SAW, BAW and FBAR types of acoustic wave band reject filters may be employed.

Figure 6:
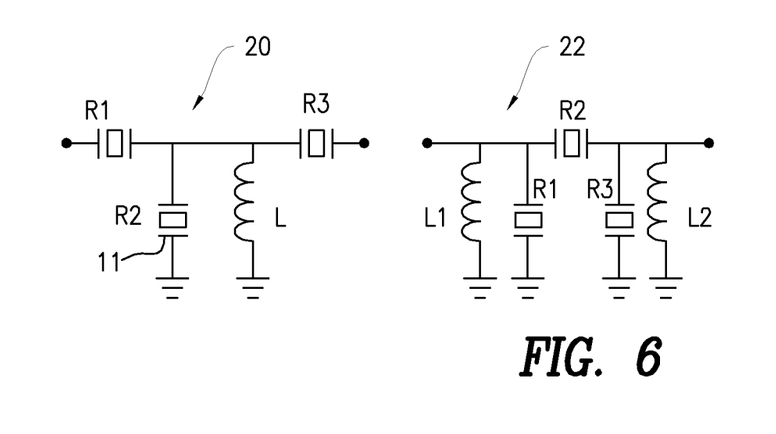
FIG. 6 is diagram of two acoustic wave band reject filter circuits and a resultant frequency response.
Figure 7:
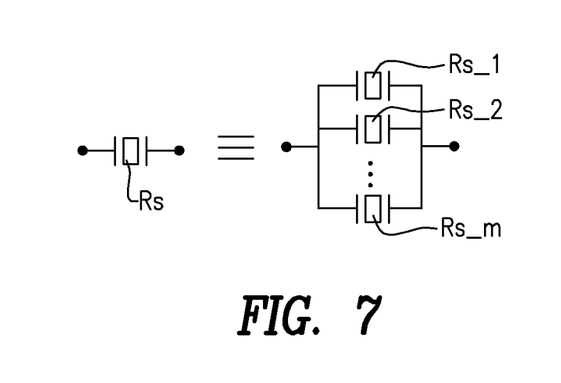
FIG. 7 is a series acoustic wave resonator circuit and its equivalent circuit.
Figure 8:
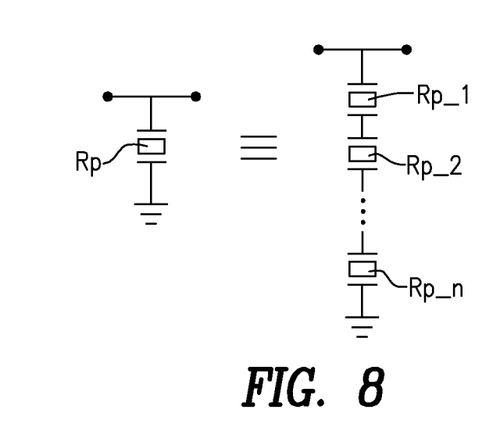
FIG. 8 is a parallel acoustic wave resonator circuit and its equivalent circuit.

FIG. 6 shows two resonator-based circuits 20 and 22 that may be implemented to form the acoustic wave band reject filter circuit blocks 10 shown in FIG. 1 to achieve a frequency response 18. The circuits 20 and 22 have three individual acoustic wave resonators 11, R1, R2 and R3. Circuit 20 is referred to as a T-type configuration—series-parallel-series—and circuit 22 is referred to as a pi-type configuration—parallel-series-parallel. In circuit 20, the inductor L is selected to match the circuit 20 to achieve a desired frequency response 18. In circuit 22, inductors L1 and L2 are selected to match the circuit 22 to achieve the frequency response 18. Well-matched circuits 20 and 22 may be cascaded to achieve a desired pass band region and reject band region. Note that a series acoustic resonator Rs can be split into m resonators Rs1, Rs2, to Rsm, as shown in FIG. 7. Similarly, a parallel acoustic resonator Rp can also be split into n resonators Rp1, Rp2 to Rpn, as shown in FIG. 8.

Figure 9:
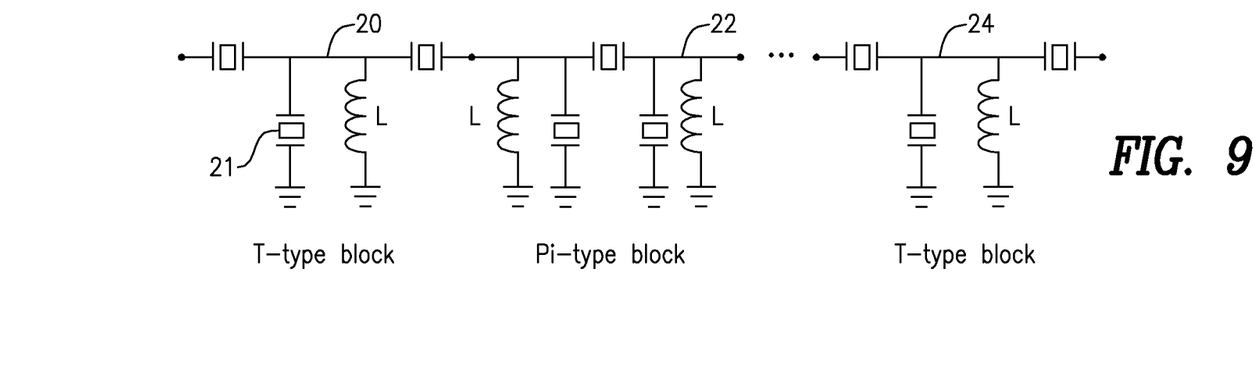
FIG. 9 is a circuit diagram of cascaded acoustic wave band reject filter circuit blocks, each filter circuit block having a T-type or pi-type configuration.

FIG. 9 is a circuit diagram of one embodiment of cascaded acoustic wave band reject filter circuit blocks 20, 22, 24. Each acoustic wave band reject filter circuit block includes at least three acoustic wave resonators 21. Each acoustic wave band reject filter circuit block is well matched in the pass band by its corresponding inductor.

Figure 10:
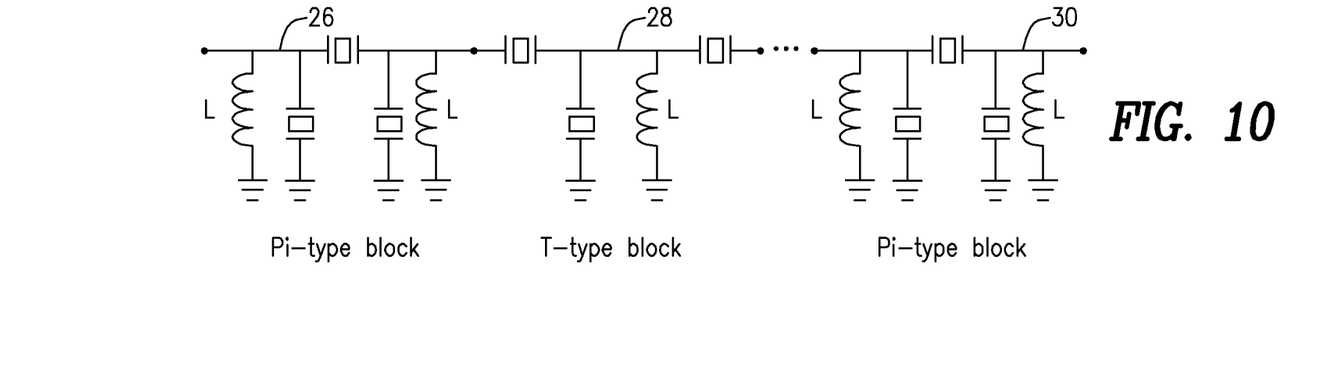
FIG. 10 is a circuit diagram of cascaded acoustic wave band reject filters circuit blocks, each filter circuit block having a pi-type or T-type configuration.
Figure 12:
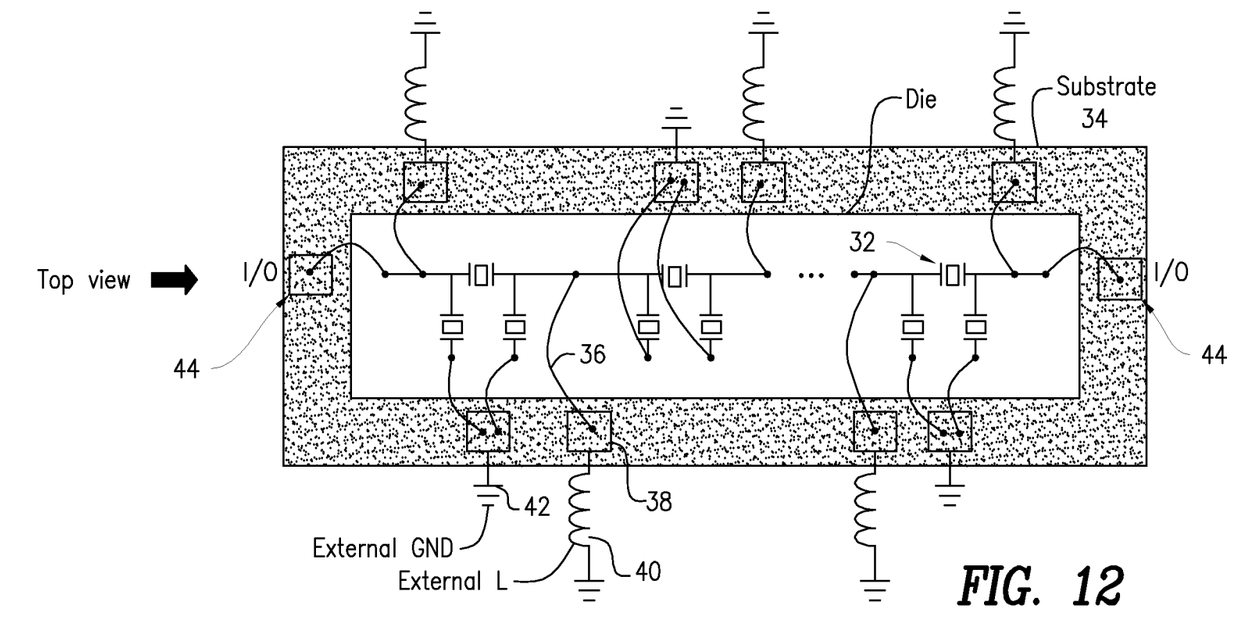
FIG. 12 is a top view of a band reject filter configuration of cascaded pi-type acoustic wave band reject filter circuit blocks of FIG. 11, having bonding wires electrically connecting electrodes on the dies to external matching inductors, external ground, and input/output ports through bonding pads on the substrate.

In the embodiment of FIG. 9 a pi-type configuration 22 of an acoustic wave band reject filter circuit block is positioned between two T-type acoustic wave band reject filter circuit blocks 20 and 24. FIG. 10 is a circuit diagram of another embodiment of cascaded acoustic wave band reject filter circuit blocks 26, 28 and 30. Each circuit block may be well matched by its corresponding inductor. In the embodiment of FIG. 8, a T-type configuration 28 (series-parallel-series) of an acoustic wave band reject filter circuit block is positioned between two pi-type (parallel-series-parallel) acoustic wave band reject filter circuit blocks 26 and 30. Other combinations of pi-type and T-type acoustic wave band reject filter circuit blocks may be implemented. Also, some embodiments may include T-type circuit blocks only, or pi-type circuit blocks only. For example, FIG. 12 shows a circuit diagram of an embodiment of cascaded pi-type circuit blocks only of acoustic wave band reject filter circuit blocks 32. Further, the number of cascaded circuit blocks may be more than three and will generally depend on performance requirements of the band reject filter.

Figure 11:
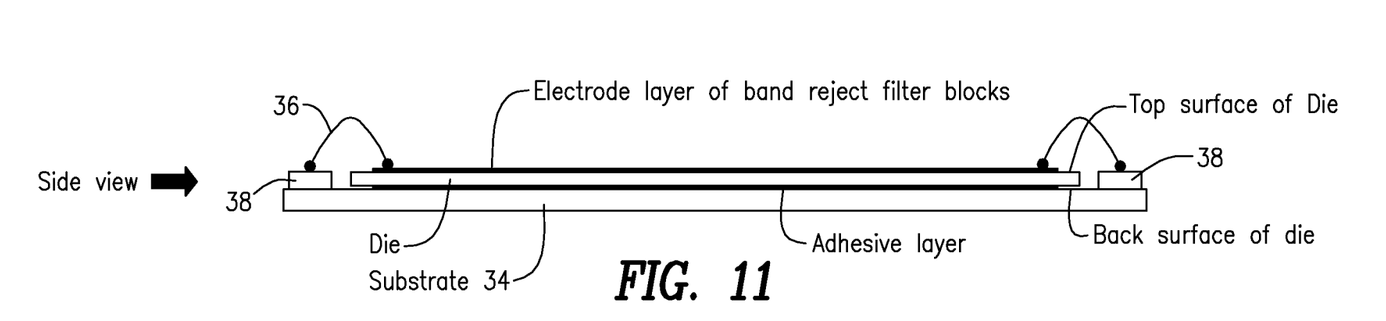
FIG. 11 is a side view of cascaded acoustic wave band reject filter circuit blocks on a single die.

FIG. 11 is a side view, and FIG. 12 is a top view of a band reject filter of cascaded acoustic wave band reject filter circuit blocks 32. In FIGS. 11 and 12, all band reject filter circuit blocks 32 are formed on a top surface of a single die. The die is mounted on a substrate 34 via a layer of adhesive between the back surface of the die and the substrate 34. Bonding wires 36 are used to electrically connect electrodes of the blocks 32 that are formed on the top surface of the die to their respective bonding pads 38 that are built on the substrate 34 to enable a band reject filter function. The bonding pads 38 are electrically connected to external inductors 40, external ground 42 and input/output, I/O, ports 44. In FIG. 12, the circuit diagram of an embodiment of cascaded pi-type circuit blocks is shown as but one example. Other cascaded filter circuit blocks of different type, such as T-type, pi-type or combination thereof, may be implemented. The matching inductors 40 may be discrete components or may be implemented by short stubs that are built on the substrate 34 using a transmission line technique. Note that matching inductors between filter circuit blocks may be combined into a single parallel equivalent inductor or may be individually selected to achieve matching of adjacent acoustic wave band reject filter circuit blocks. Note also that the substrate 34 can be part of a larger printed circuit board, PCB, or could be the substrate of a module or package. The package may provide a cover to protect the die upon which the filter circuit blocks 32 are formed.

Using bonding wires 36 to electrically connect the filter circuit blocks 32 to external components may become unsuitable if many bonding wires are needed, such as is the case with many acoustic wave band reject filter circuit blocks. This is because the bonding wires produce parasitic inductances that degrade circuit performance, by causing, for example, mismatches of the acoustic wave band reject filter circuit blocks. Also, repeatability when using bonding wires is difficult to achieve, resulting in low product yield in the manufacturing process.

Figure 13:
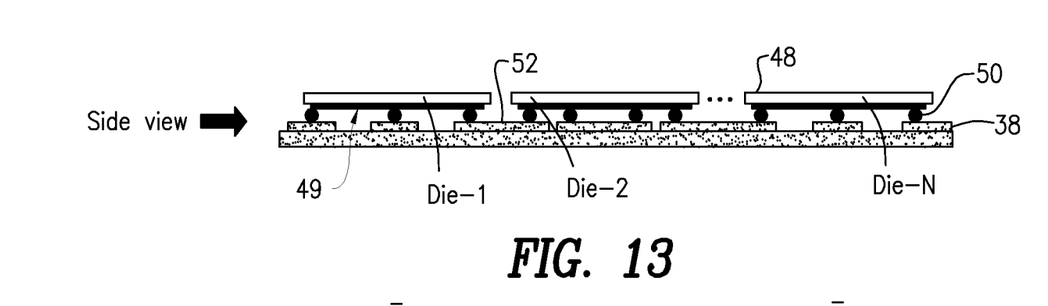
FIG. 13 is a side view of a band reject filter configuration of cascaded T-type and pi-type acoustic wave band reject filter circuit blocks, having solder balls electrically connecting electrodes on the dies to external matching inductors, external ground, and input/output ports through bonding pads on the substrate.
Figure 14:
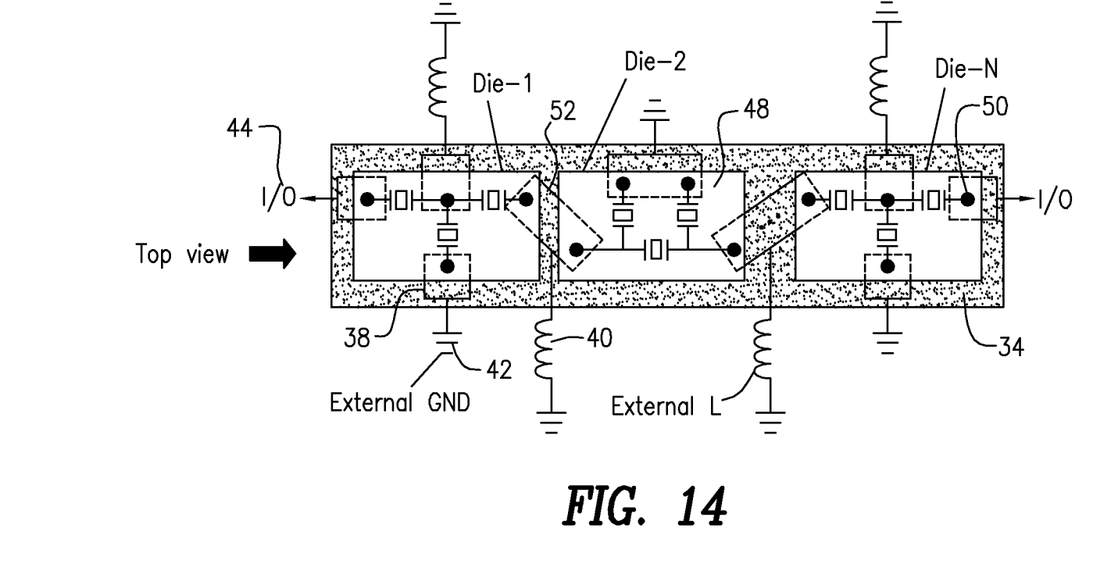
FIG. 14 is a top view of the band reject filter configuration of cascaded T-type and pi-type acoustic wave band reject filter circuit blocks of FIG. 13

To eliminate the bonding wires and to utilize flip-chip technology—in which a die is positioned with the electrodes 49 formed on the die facing the substrate—the configuration of FIGS. 13 and 14 can be employed. FIG. 13 is a side view and FIG. 14 is a corresponding top view of a band reject filter configuration of cascaded acoustic wave band reject filter circuit blocks 48 having bonding pads 38 built on the substrate 34, electrically connecting the electrodes 49 of the circuit on the die to external inductors 40, external grounds 42, and I/O ports 44 through solder balls 50. Each acoustic wave band reject filter circuit block is formed on a separate die 48. Each die 48 is mounted on the substrate 34 through solder balls 50. A die 48 is positioned such that the solder balls 50 connect the electrodes 49 on the die to bonding pads 38 on the substrate 34. Note that the embodiment of FIG. 14 shows a pi-type circuit block between two T-type circuit blocks. In some embodiments, the solder balls are disposed upon the die after the one or more resonator circuits are formed on the die, and in some embodiments, the solder balls are disposed on the substrate before the dies are positioned above the substrate.

Note that a difference between dies shown in FIGS. 12 and 14 is that, in FIG. 12, all of the acoustic wave band reject filter circuit blocks are formed on the same die, whereas in FIG. 14, each acoustic wave band reject filter circuit block is formed on a different die.

Figure 15:
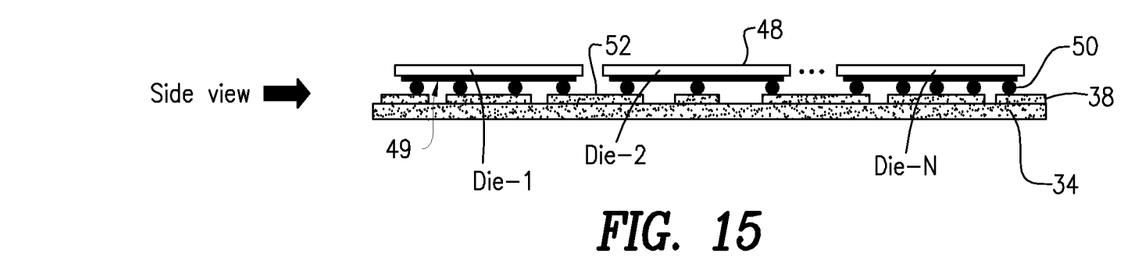
FIG. 15 is a side view, of a band reject filter configuration of an alternative group of cascaded T-type and pi-type acoustic wave band reject filter circuit blocks, having solder balls electrically connecting electrodes on the dies to external inductors, external ground, and input/output ports through bonding pads on the substrate.
Figure 16:
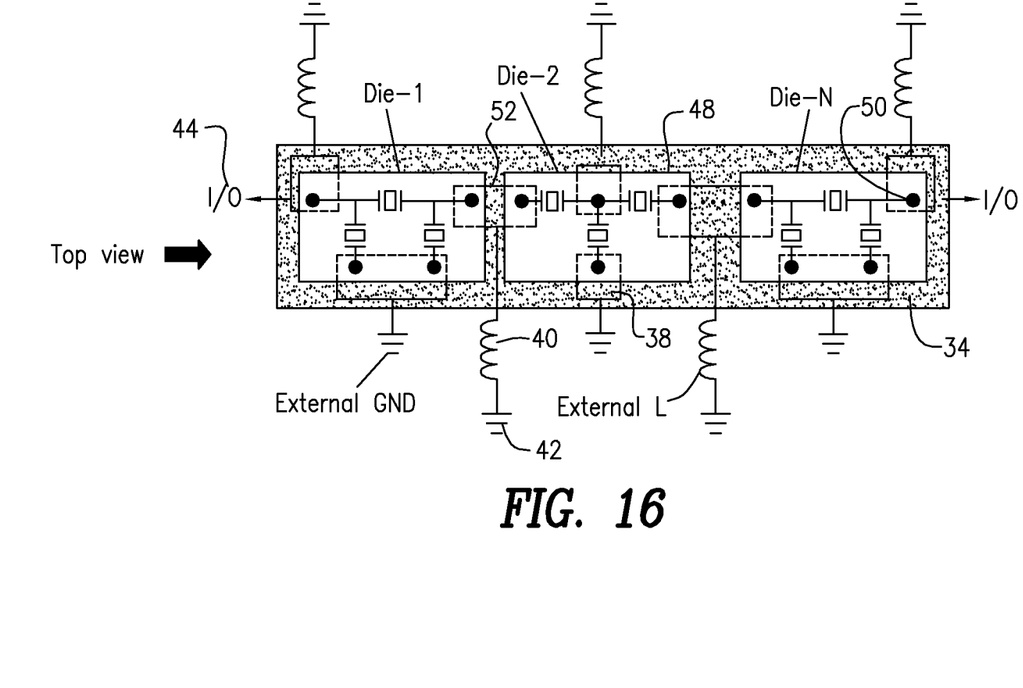
FIG. 16 is a top view of the band reject filter configuration of the alternative group of cascaded T-type and pi-type acoustic wave band reject filter circuit blocks of FIG. 15.

FIGS. 15 and 16 are similar to FIGS. 13 and 14, except that in FIG. 16, a T-type circuit block is between two pi-type circuit blocks. In the configuration of FIG. 14, bonding pads 52 on the substrate that electrically connect adjacent acoustic wave band reject filter circuit blocks are diagonal with respect to a main axis of the substrate 34, whereas FIG. 16 shows that the bonding pads 52 electrically connecting adjacent acoustic wave band reject filter circuit blocks 48 are parallel to a main axis of the substrate 34. Note that although only three acoustic wave band reject filter circuit blocks are shown in FIGS. 14 and 16, more or fewer acoustic wave band reject filter circuit blocks may be implemented. Also, various circuit diagrams of cascaded acoustic wave band reject filter circuit blocks can be applied to the band reject filter configurations shown in FIGS. 14 and 16.

Note that one embodiment of the flip chip technology may be limited to dies of sizes having a largest dimension around 2.5-3.0 millimeters. This is because the die 48 is rigidly fixed on the substrate 34 by the solder balls 50, so that a larger die might produce a larger thermal mismatch between the die and the substrate and break the electrical connections between the electrodes of the dies and the bonding pads 38. Thus, in some embodiments, each acoustic wave band reject filter circuit block is formed on a separate die, each separate die having a largest dimension less than about 3 millimeters. Also, in some embodiments, a separate die can have more than one acoustic wave band reject filter circuit blocks formed on the die if the die size is less than about 3 millimeters.

Adjacent dies are electrically connected through the bonding pads 52 built on the substrate 34. Since the bonding pads 52 built on the substrate 34 have lower ohmic resistance than connecting bus bars formed on the die 48, the acoustic wave band reject filter may have lower insertion loss than known designs. Further, the solder balls 50 provide electrical connections with negligible parasitic resistance and inductance. In addition, the manufacture of the solder balls 50 is very stable, resulting in high product yield. Note also that the various die 48 need not be mounted in a straight line, as shown in FIGS. 13 and 14, but may be mounted in any suitable orientation, thereby providing greater design flexibility. Further, each acoustic wave band reject filter circuit block 48 may be implemented with a SAW, BAW or FBAR device or any combination thereof.

Figure 17:
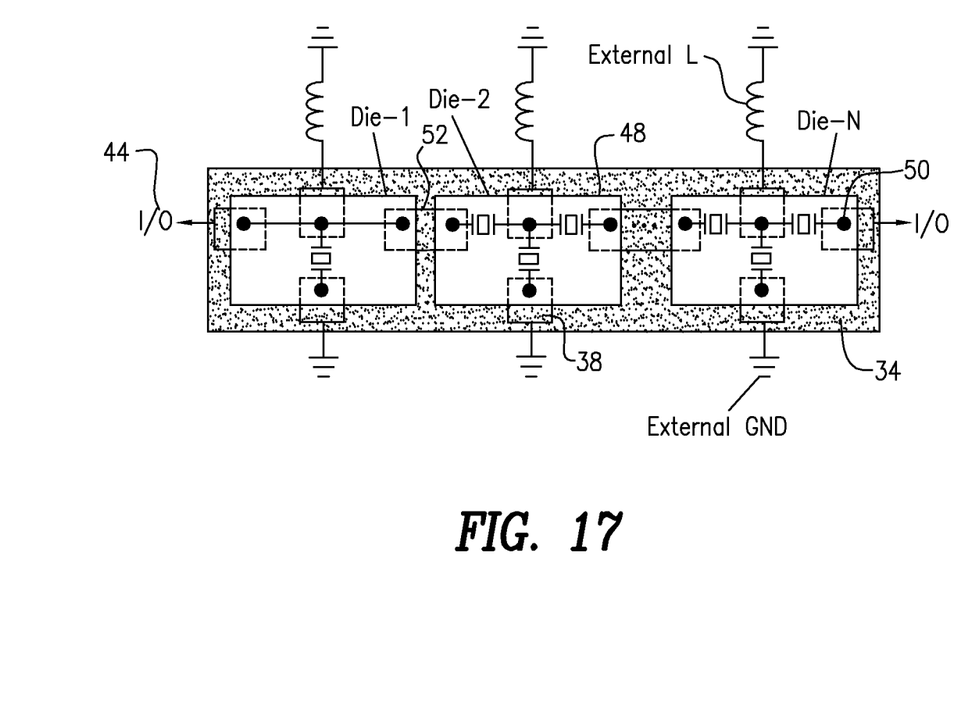
FIG. 17 is a top view of a band reject filter having an acoustic wave band reject filter circuit block with a single resonator.
Figure 18:
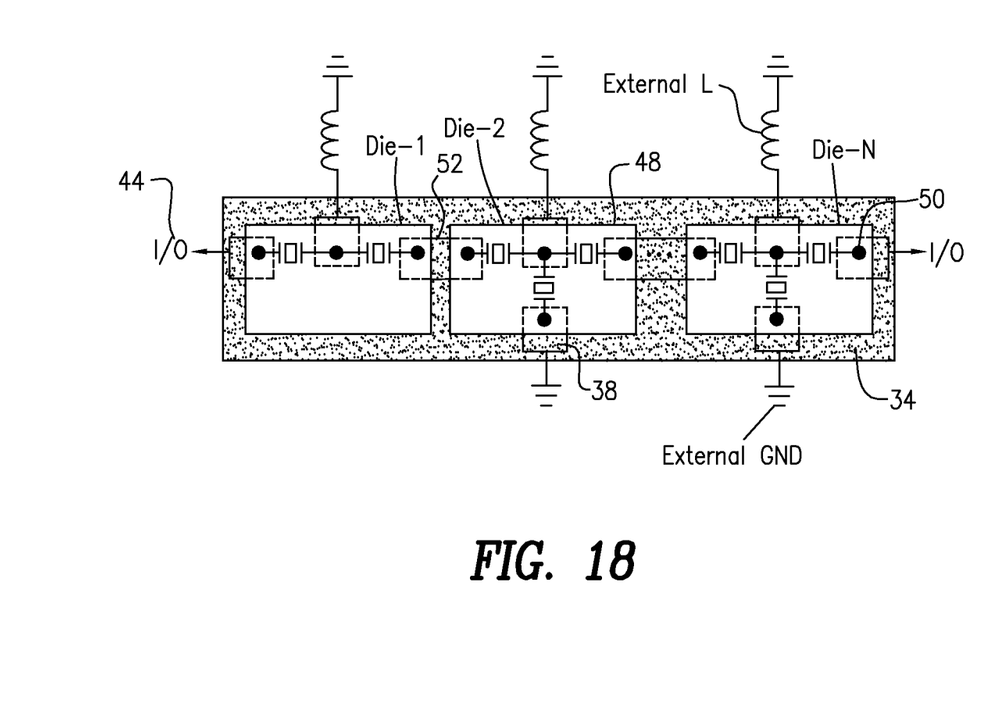
FIG. 18 is a top view of a band reject filter having an acoustic wave band reject filter circuit block with two resonators.

FIG. 17 is a top view of a band reject filter having an acoustic wave band reject filter circuit block with a single resonator on a die. FIG. 18 is a top view of a band reject filter having an acoustic wave band reject filter circuit block with two resonators on a die. Thus, as shown in FIGS. 17 and 18, a single die may have only a single resonator, two resonators, three or more resonators.

Figure 19:
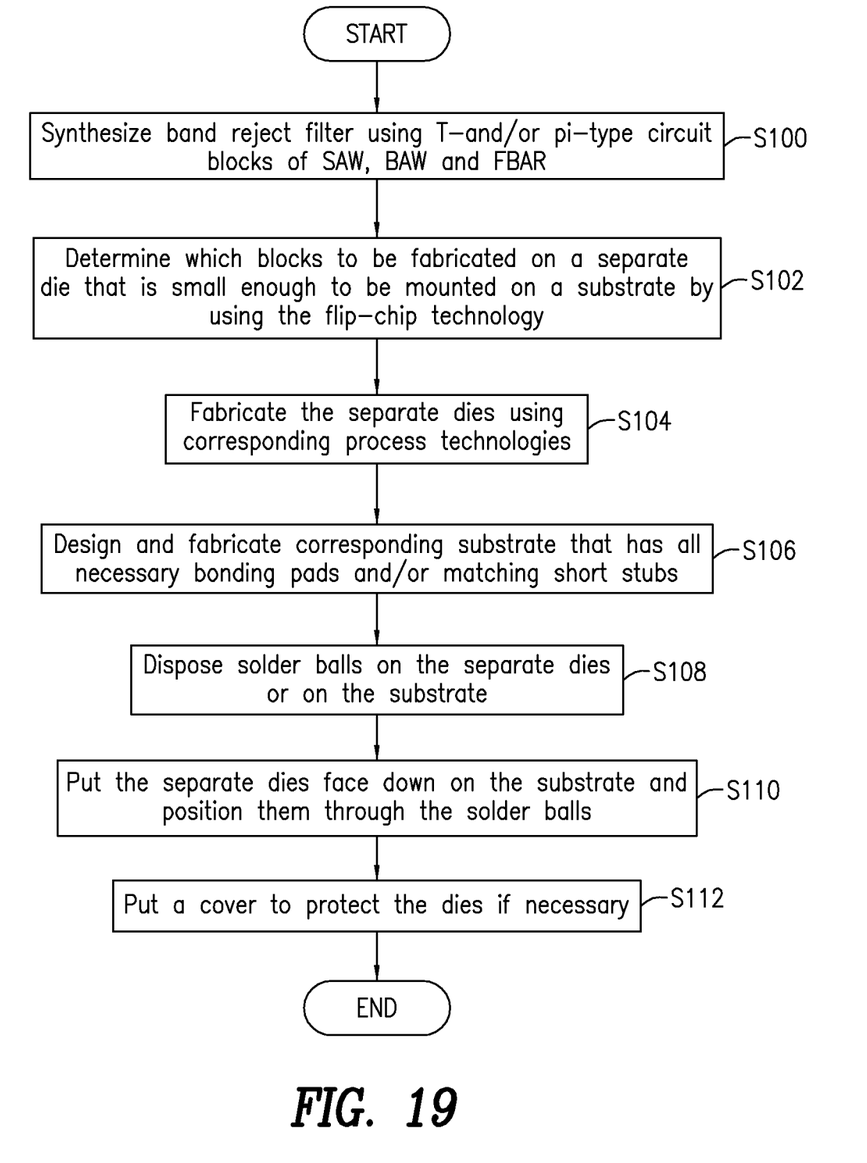
FIG. 19 is a flow chart of an exemplary process for constructing an acoustic wave band reject filter according to principles of the present invention.

FIG. 19 is a flow chart of an exemplary process for constructing a flip-chip acoustic wave band reject filter. A band reject filter is synthesized using T and/or pi type acoustic wave band reject filter circuit blocks of SAW, BAW, and/or FBAR (block S100). A determination is made as to which circuit blocks of the filter circuit are to be fabricated on a separate die that is small enough to be mounted on a substrate using the flip-chip technology (block S102). The separate dies are fabricated using their corresponding process technologies (block S104). The corresponding substrate that has all necessary bonding pads and/or matching short stubs is designed and fabricated (block S106). Solder balls are disposed on the separate dies or on the substrate (block S108). The separate dies are flipped and put on the substrate and positioned via the solder balls (block S110). A cover may be put over the separate dies for their protection, if needed (block S112). In some embodiments, the process may further include providing connecting bonding pads on the substrate to replace the connecting bus bars that are used on the dies for connecting resonators on the same die, and may further include providing an inductor external to the substrate in which at least one bonding pad electrically connects to the external inductor.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. An acoustic wave band reject filter, comprising:
 a substrate, the substrate including bonding pads formed on the substrate; a plurality of dies, each die having a side facing the substrate and having electrodes; a plurality of acoustic wave band reject filter circuit blocks, at least one acoustic wave band reject filter circuit block being formed on a corresponding die and having at least one resonator, the electrodes being formed on the side of the corresponding die facing the substrate;
 a plurality of solder balls positioned between the substrate and the dies, to electrically connect bonding pads on the substrate and corresponding electrodes on the plurality of dies and to mechanically fix the dies to the substrate, at least one of the bonding pads on the substrate electrically connecting adjacent dies via the solder balls; and
 the plurality of acoustic wave band reject filter circuit blocks collectively exhibiting a band reject filter frequency response.

2. The acoustic wave band reject filter of claim 1, wherein each of the plurality of acoustic wave band reject filter circuit blocks have adjacent, partially overlapping band reject filter frequency responses.

3. The acoustic wave band reject filter of claim 1, wherein an acoustic wave band reject filter circuit block is arranged as one of a series-parallel-series electrical circuit configuration and a parallel-series-parallel electrical circuit configuration.

4. The acoustic wave band reject filter of claim 1, wherein an acoustic wave band reject filter circuit block is one of a surface acoustic wave filter, a bulk acoustic wave filter, and a film bulk acoustic resonator filter.

5. The acoustic wave band reject filter of claim 1, further comprising an inductor external to the substrate, wherein at least one bonding pad electrically connects the external inductor to one of the plurality of dies via the solder balls and without bonding wires.

6. The acoustic wave band reject filter of claim 5, wherein the external inductor is electrically connected to a bonding pad positioned between dies.

7. The acoustic wave band reject filter of claim 1, wherein a single die has a plurality of acoustic wave band reject filter circuit blocks.

8. A method for constructing an acoustic wave band reject filter, the method comprising:
 forming bonding pads on a substrate;
 providing a plurality of dies, each die having a side that faces the substrate, each die having a length and a width, a largest one of the length and width being less than about 3 millimeters to reduce thermal mismatch between a die and the substrate;
 forming solder balls on one of the substrate and each of the plurality of dies on the sides of the dies facing the substrate;
 forming an acoustic wave band reject filter circuit block on each one of the plurality of dies on the side of the die facing the substrate, the acoustic wave band reject filter circuit blocks being cascaded;
 positioning the plurality of dies on the substrate such that the solder balls electrically connect electrode of the dies and bonding pads of the substrate and to mechanically fix the dies to the substrate; and providing connecting bonding pads on the substrate, the connecting bonding pads electrically connecting adjacent cascaded acoustic wave band reject filter circuit blocks.

9. The method of claim 8, wherein the cascaded acoustic wave band reject filter circuit blocks have adjacent overlapping band reject filter frequency responses.

10. An acoustic wave band reject filter, comprising:
a substrate having bonding pads thereon;
a first die having electrodes and a second die having electrodes, each of the first die and the second die having a side that faces the substrate;
a plurality of solder balls, the solder balls positioned to electrically connect bonding pads of the substrate to electrodes of the first and second die;
a first acoustic wave band reject filter circuit formed on the first die;
a second acoustic wave band reject filter circuit formed on the second die; and
a first connecting bonding pad formed on the substrate and configured to electrically connect the first acoustic wave band reject filter circuit to the second acoustic wave band reject filter circuit via the solder balls.

11. The acoustic wave band reject filter of claim 10, further comprising:
a third die having a side facing the substrate and having electrodes;
a plurality of solder balls positioned to electrically connect bonding pads of the substrate to electrodes of the third die;
a third acoustic wave band reject filter circuit formed on the third die; and
a second connecting bonding pad formed on the substrate and configured to electrically connect the second acoustic wave band reject filter circuit to the third acoustic wave band reject filter circuit via the solder balls.

12. The acoustic wave band reject filter of claim 10, wherein the first and second acoustic wave band reject filter circuits have adjacent overlapping band reject filter frequency responses.

13. The acoustic wave band reject filter of claim 10, wherein the first acoustic wave band reject filter circuit is one of a series-parallel-series circuit and a parallel-series-parallel circuit.

14. The acoustic wave band reject filter of claim 10, wherein the second acoustic wave band reject filter circuit is one of a series-parallel-series circuit and a parallel-series-parallel circuit.

15. An acoustic wave band reject filter, comprising:
a substrate having bonding pads formed thereon;
a first die being fixed on the substrate and having at least one band reject filter circuit block formed on the first die, the at least one band reject filter circuit block being at least one of a series-parallel-series configuration and a parallel-series-parallel configuration;
a second die being fixed on the substrate and having at least one band reject filter, the second die and the first die being connected by a bonding pad via solder balls; and
at least one inductive component connected in parallel with at least one of the at least one band reject filter circuit block.

16. The acoustic wave band reject filter of claim 15, wherein a frequency response of the at least one band reject filter bock formed on the first die partially overlaps a frequency response of the at least one band reject filter circuit block formed on the second die.

* * * * *